(12) United States Patent
Wang et al.

(10) Patent No.: US 10,141,205 B2
(45) Date of Patent: Nov. 27, 2018

(54) APPARATUS AND METHOD FOR CLEANING SEMICONDUCTOR WAFER

(71) Applicant: ACM Research (Shanghai) Inc., Shanghai (CN)

(72) Inventors: Xi Wang, Shanghai (CN); Cheng Cheng, Shanghai (CN); Jun Wu, Shanghai (CN); Hui Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 0 days.

(21) Appl. No.: 15/514,062

(22) PCT Filed: Sep. 26, 2014

(86) PCT No.: PCT/CN2014/087493
§ 371 (c)(1),
(2) Date: Mar. 24, 2017

(87) PCT Pub. No.: WO2016/045072
PCT Pub. Date: Mar. 31, 2016

(65) Prior Publication Data
US 2017/0250096 A1     Aug. 31, 2017

(51) Int. Cl.
*H01L 21/67*     (2006.01)
*H01L 21/687*     (2006.01)
(Continued)

(52) U.S. Cl.
CPC ........ *H01L 21/67046* (2013.01); *B08B 1/002* (2013.01); *B08B 1/02* (2013.01);
(Continued)

(58) Field of Classification Search
None
See application file for complete search history.

(56) References Cited

U.S. PATENT DOCUMENTS 5,846,335 A * 12/1998 Maekawa ............... B08B 1/007
                                              134/32
6,652,662 B1 * 11/2003 Ishihara ................... B08B 1/00
                                           134/104.1
(Continued)

FOREIGN PATENT DOCUMENTS

CN         1428821 A     7/2003
CN      101441978 A     5/2009
(Continued)

OTHER PUBLICATIONS

English Machine Translation of KR 2003-0037009 A.*
(Continued)

*Primary Examiner* — Nicole Blan
(74) *Attorney, Agent, or Firm* — Osha Liang LLP (57) ABSTRACT

An apparatus and method for cleaning semiconductor wafer are provided. The apparatus includes a brush module, a swing arm, a rotating actuator and an elevating actuator. The brush module has a brush head for providing mechanical force on a surface of a wafer. An end of the swing arm mounts the brush module. The rotating actuator is connected with the other end of the swing arm. The rotating actuator drives the swing arm to swing across the whole surface of the wafer, which brings the brush head moving across the whole surface of the wafer. The elevating actuator is connected with the other end of the swing arm. The elevating actuator drives the swing arm to rise or descend, which brings the brush module rising or descending. The apparatus cleans the semi-conductor wafer by means of the brush head, which improves the cleaning effect.

10 Claims, 7 Drawing Sheets

(51) Int. Cl.
  *H01L 21/02* (2006.01)
  *B08B 1/04* (2006.01)
  *B08B 1/00* (2006.01)
  *B08B 1/02* (2006.01)
  *B08B 3/04* (2006.01)
  *B08B 3/08* (2006.01)

(52) U.S. Cl.
  CPC ............ *B08B 1/04* (2013.01); *B08B 3/041* (2013.01); *B08B 3/08* (2013.01); *H01L 21/02096* (2013.01); *H01L 21/68764* (2013.01)

(56) References Cited

U.S. PATENT DOCUMENTS

| | | | | |
|---|---|---|---|---|
| 2003/0041878 | A1* | 3/2003 | Shimada | B08B 1/00 134/6 |
| 2003/0046786 | A1 | 3/2003 | Shirley et al. | |
| 2009/0049981 | A1* | 2/2009 | Hayashi | F15B 15/24 92/13 |
| 2010/0247761 | A1* | 9/2010 | Hashimoto | H01L 21/67051 427/240 |
| 2014/0310895 | A1* | 10/2014 | Chen | H02P 29/00 15/21.1 |

FOREIGN PATENT DOCUMENTS

| | | |
|---|---|---|
| CN | 101884981 A | 11/2010 |
| KR | 20030037009 A | 5/2003 |

OTHER PUBLICATIONS

International Search Report issued in corresponding application No. PCT/CN2014/087493 dated Jan. 4, 2015 (2 pages).

Written Opinion of the International Searching Authority issued in corresponding application No. PCT/CN2014/087493 dated Jan. 4, 2015 (4 pages).

* cited by examiner

APPARATUS AND METHOD FOR CLEANING SEMICONDUCTOR WAFER

BACKGROUND OF THE INVENTION

1. Field of the Invention

The present invention generally relates to a field of cleaning technique for semiconductor wafer, and more particularly relates to an apparatus and method for cleaning semiconductor wafer by means of physical cleaning, such as brush cleaning.

2. The Related Art

During the process of semiconductor devices manufacturing, almost every working procedure involves cleaning, and the higher the integration level of the semiconductor devices is, the more cleaning procedures are needed. In many of the cleaning procedures, as long as one cleaning procedure is not able to meet requirement, the whole batch of chips are scrapped. Therefore, cleaning is very important for manufacture of semiconductor devices.

Contaminants which are produced and adhered to a wafer during manufacturing the semiconductor device mainly include particles, metal contaminants and organic contaminants. At present, a traditional method for removing the contaminants on the wafer is wet cleaning or dry cleaning. Wet cleaning employs chemical solutions or deionized water to rinse the wafer so as to effectively remove the contaminants, while dry cleaning employs gases to remove the contaminants remained on the wafer. Either wet cleaning or dry cleaning mainly relies on chemical reaction to remove the contaminants and doesn't utilize physical force acted on the wafer surface. However, with the structure of the semiconductor devices becoming more complex, the cleaning requirements of the wafer surface accordingly becomes higher and higher. The traditional cleaning apparatus and method no longer meet process requirement. Therefore, an improved apparatus and method for cleaning semiconductor wafer need to be created out to meet the demands of the development of the semiconductor technology.

SUMMARY

The present invention provides an apparatus and method for cleaning semiconductor wafer by means of a brush head, which improves the cleaning effect and meets the demands of the development of the semiconductor technology.

According to the present invention, an apparatus for cleaning semiconductor wafer includes a brush module, a swing arm, a rotating actuator and an elevating actuator. The brush module has a brush head for providing mechanical force on a surface of a wafer. An end of the swing arm mounts the brush module. The rotating actuator is connected with the other end of the swing arm. The rotating actuator drives the swing arm to swing across the whole surface of the wafer, which brings the brush head moving across the whole surface of the wafer. The elevating actuator is connected with the other end of the swing arm. The elevating actuator drives the swing arm to rise or descend, which brings the brush module rising or descending.

According to the present invention, a method for cleaning semiconductor wafer includes the following steps: loading a wafer on a wafer chuck and rotating the wafer; delivering cleaning chemicals or de-ionized water to the surface of the wafer; moving a brush module into a cleaning chamber and a brush head of the brush module being above the surface of the wafer; moving the brush module down to a position close to the surface of the wafer at a first speed; moving the brush module down to a process position with a preset height at a second speed; swinging the brush head of the brush module across the surface of the wafer based on a pre-set recipe; moving the brush module up to a position above the wafer; swinging the brush module out of the cleaning chamber; stopping delivering cleaning chemicals or de-ionized water to the surface of the wafer; drying the wafer; and unloading the wafer from the wafer chuck.

BRIEF DESCRIPTION OF THE DRAWINGS

The present invention will be apparent to those skilled in the art by reading the following description of embodiments thereof, with reference to the attached drawings, in which.

DETAILED DESCRIPTION OF EMBODIMENTS

Figure 1A:
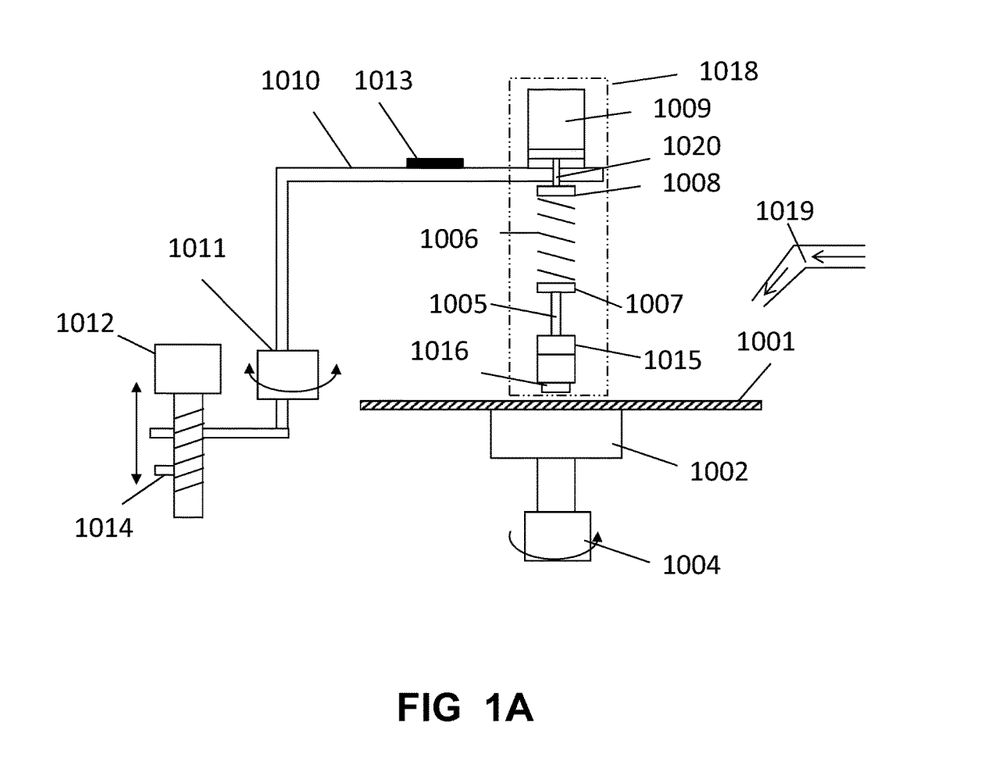
FIG. 1A illustrates an apparatus for cleaning semiconductor wafer according to an exemplary embodiment of the present invention.

Referring to FIG. 1A, FIG. 1A illustrates an apparatus for cleaning semiconductor wafer according to an exemplary embodiment of the present invention. The apparatus includes a brush module 1018, a swing arm 1010, a rotating actuator 1011 and an elevating actuator 1012.

The brush module 1018 is mounted on an end of the swing arm 1010. The brush module 1018 is vertically disposed and includes a brush head 1016, a brush base 1015, a lower bearing 1005, a lower mounting section 1007, a coil spring 1006, an upper mounting section 1008, an upper bearing 1020 and a damper 1009. The brush head 1016 is mounted on the brush base 1015. An end of the lower bearing 1005 connects to the brush base 1015 and the other end of the lower bearing 1005 connects to the lower mounting section 1007. An end of the coil spring 1006 is fixed on the lower mounting section 1007 and the other end of the coil spring 1006 is fixed on the upper mounting section 1008 which is disposed opposite the lower mounting section 1007. The upper mounting section 1008 connects to an end of the upper bearing 1020 and the other end of the upper bearing 1020 connects to the damper 1009. The damper 1009, which is liquid type or gas type, is used to keep the brush module 1018 stable at vertical direction during process. The brush head 1016 can be made of PVA sponge or nylon filament.

The other end of the swing arm 1010 is connected with the rotating actuator 1011 and the elevating actuator 1012. The rotating actuator 1011 drives the swing arm 1010 to swing across a whole wafer surface, so the brush head 1016 may move across the whole wafer surface during the cleaning process. The elevating actuator 1012 drives the swing arm 1010 to rise or descend, so the press force that the brush module 1018 acts on the wafer surface may be adjusted. The swing arm 1010 is able to swing, rise or descend, or swing and simultaneously rise or descend under the drive of the rotating actuator 1011 or/and the elevating actuator 1012. A hard stopper 1014 is installed on the elevating actuator 1012 for restricting the vertical descend distance of the swing arm 1010 so as to restrict the press force of the brush head 1016 pressing on the wafer surface in an acceptable range. A strain gauge 1013 is positioned on the swing arm 1010 to monitor the deformation of the coil spring 1006 while the brush head 1016 pressing on the wafer surface.

The apparatus further includes a cleaning chamber (not shown in FIG. 1A), the cleaning chamber includes a wafer chuck 1002, a rotation driving mechanism 1004 and at least one nozzle 1019. The wafer chuck 1002 is disposed in the cleaning chamber for holding and positioning a wafer 1001. The rotation driving mechanism 1004 drives the wafer chuck 1002 to rotate. The at least one nozzle 1019 delivers cleaning chemicals or de-ionized water onto the surface of the wafer 1001.

When using the apparatus to cleaning the wafer 1001, the wafer 1001 is loaded on the wafer chuck 1002. The rotation driving mechanism 1004 drives the wafer chuck 1002 to rotate at a rotating speed. Preferably, the rotating speed is 30 RPM to 1500 RPM. The nozzle 1019 delivers cleaning chemicals or de-ionized water onto the surface of the wafer 1001 and the flow rate of the cleaning chemicals or de-ionized water is controlled in range of 100 ml/min to 4000 ml/min. The rotating actuator 1011 drives the swing arm 1010 to swing and make the brush module 1018 move into the cleaning chamber and the brush head 1016 is above the surface of the wafer 1001. Then the elevating actuator 1012 drives the swing arm 1010 to descend and make the brush module 1018 descend to a position close to the surface of the wafer 1001 at a first speed. The swing arm 1010 continues to descend by the drive of the elevating actuator 1012 and make the brush module 1018 move down to a process position with a preset height at a second speed which is slower than the first speed. Both the first speed and the second speed are individually controllable. The rotating actuator 1011 drives the swing arm 1010 to swing and make the brush head 1016 of the brush module 1018 move across the surface of the wafer 1001 based on a pre-set recipe for cleaning the surface of the wafer 1001. After the pre-set recipe is end of run, the swing arm 1010 stops swing and the elevating actuator 1012 drives the swing arm 1010 to rise so that the brush module 1018 is risen to a position above the surface of the wafer 1001. The rotating actuator 1011 drives the swing arm 1010 to swing and move the brush module 1018 out of the cleaning chamber. The nozzle 1019 stops delivering cleaning chemicals or de-ionized water onto the surface of the wafer 1001. At last, dry the wafer 1001 and unload the wafer 1001 from the wafer chuck 1002.

In the cleaning process described above, the brush module 1018 provides a mechanical force to the surface of the wafer 1001 and the strength of the mechanical force is controlled by driving the swing arm 1010 to rise or descend with the elevating actuator 1012. The swing arm 1010 is driven by the rotating actuator 1011 to swing and make the brush head 1016 move across the whole surface of the wafer 1001 while the wafer 1001 rotates along with the wafer chuck 1002. The swing arm 1010 is also driven by the elevating actuator 1012 to move down towards the wafer 1001 with a controllable vertical moving speed. The elevating actuator 1012 controls the swing arm 1010 and the brush module 1018 to a process position where the brush head 1016 presses on the surface of the wafer 1001. The elastic deformation of the coil spring 1006, which generates the press force that the brush head 1016 acts on the surface of the wafer 1001, is determined by the height of the brush module 1018 process position. The nozzle 1019 delivers cleaning chemicals or de-ionized water to the surface of the wafer 1001, while the brush head 1016 presses on the surface of the wafer 1001. The cleaning chemicals or de-ionized water form a soft media between the brush head 1016 and the surface of the wafer 1001 so as to prevent scratch or damage on structures formed on the surface of the wafer 1001.

Figure 1B:
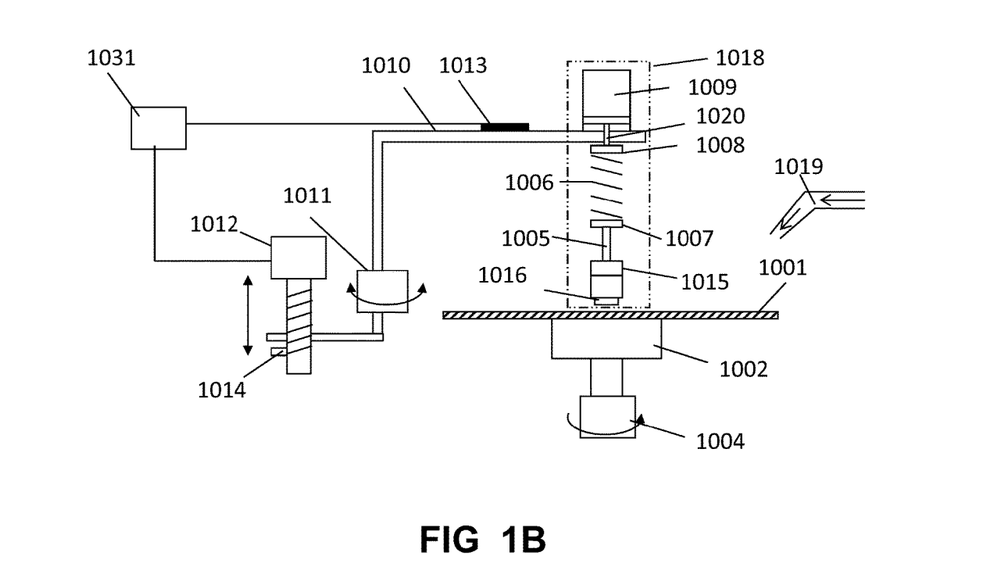
FIG. 1B illustrates an apparatus for cleaning semiconductor wafer according to another exemplary embodiment of the present invention.

Referring to FIG. 1B illustrating an apparatus for cleaning semiconductor wafer according to another exemplary embodiment of the present invention, the apparatus adds a controller 1031 on the basis of the apparatus illustrated in FIG. 1A. The controller 1031 respectively connects with the strain gauge 1013 and the elevating actuator 1012. The strain gauge 1013, the controller 1031 and the elevating actuator 1012 form a close loop control for controlling a vertical process position of the swing arm 1010 in real time while the swing arm 1010 scanning across the surface of the wafer 1001 during the cleaning process, so a vertical process position of the brush module 1018 may be controlled in real time. The press force of the brush module 1018 acted onto the surface of the wafer 1001 is detected by the strain gauge 1013 and the strain gauge 1013 produces a detecting signal. The strain gauge 1013 sends the detecting signal to the controller 1031. The controller 1031 receives the detecting signal and gives a feedback to the elevating actuator 1012. The elevating actuator 1012 adjusts the height of the process position of the swing arm 1010 based on the feedback of the controller 1031.

Figure 2A:
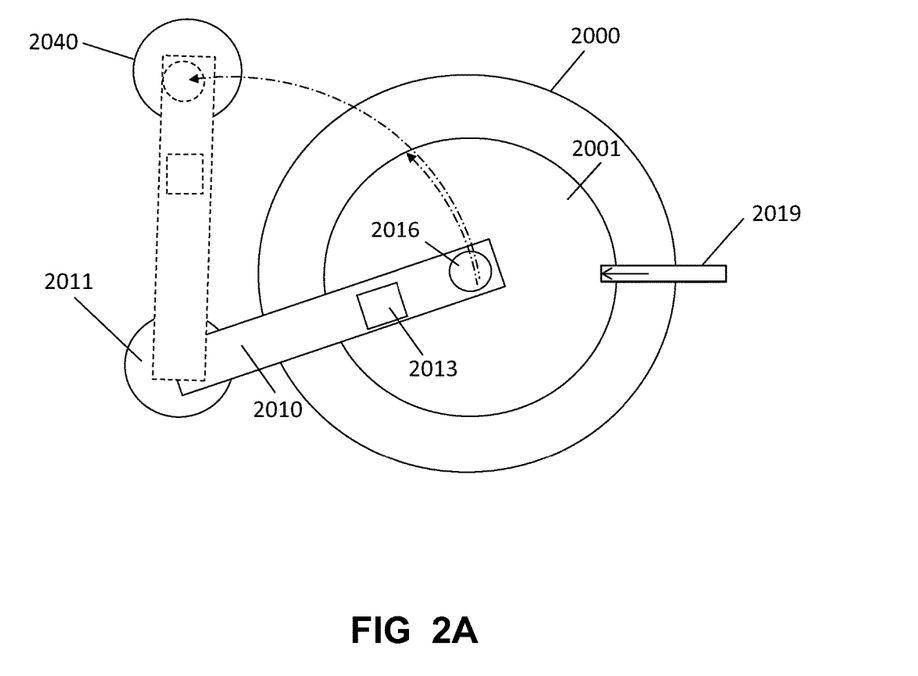
FIGS. 2A and 2B illustrate an apparatus for cleaning semiconductor wafer according to further another exemplary embodiment of the present invention.
Figure 2B:
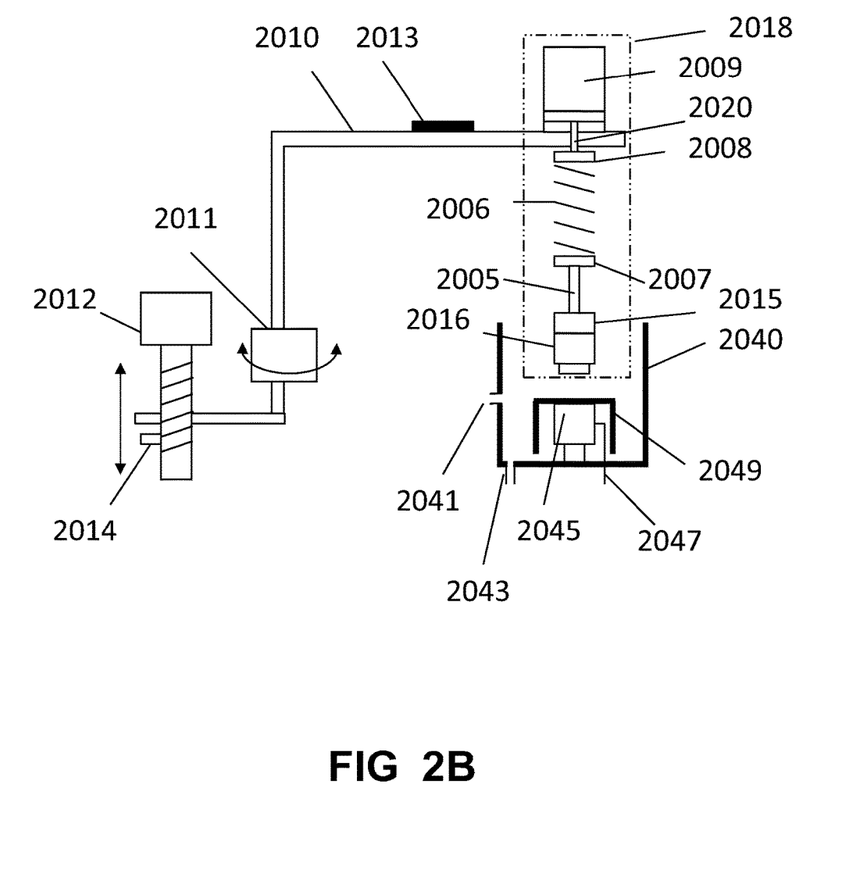

Referring to FIGS. 2A and 2B illustrating an apparatus for cleaning semiconductor wafer according to another exemplary embodiment of the present invention, the apparatus includes a brush module 2018, a swing arm 2010, a rotating actuator 2011 and an elevating actuator 2012.

The brush module 2018 is mounted on an end of the swing arm 2010. The brush module 2018 is vertically disposed and includes a brush head 2016, a brush base 2015, a lower bearing 2005, a lower mounting section 2007, a coil spring 2006, an upper mounting section 2008, an upper bearing 2020 and a damper 2009. The brush head 2016 is mounted on the brush base 2015. An end of the lower bearing 2005 connects to the brush base 2015 and the other end of the lower bearing 2005 connects to the lower mounting section 2007. An end of the coil spring 2006 is fixed on the lower mounting section 2007 and the other end of the coil spring 2006 is fixed on the upper mounting section 2008 which is disposed opposite the lower mounting section 2007. The upper mounting section 2008 connects to an end of the upper bearing 2020 and the other end of the upper bearing 2020 connects to the damper 2009. The damper 2009, which is liquid type or gas type, is used to keep the brush module 2018 stable at vertical direction during process.

The other end of the swing arm 2010 is connected with the rotating actuator 2011 and the elevating actuator 2012. The rotating actuator 2011 drives the swing arm 2010 to swing across a whole wafer surface, so the brush module 2018 may move across the whole wafer surface during the cleaning process. The elevating actuator 2012 drives the swing arm 2010 to rise or descend, so the press force that the brush module 2018 acts on the wafer surface can be adjusted. The swing arm 2010 is able to swing, rise or descend, or swing and simultaneously rise or descend under the drive of the rotating actuator 2011 or/and the elevating actuator 2012. A hard stopper 2014 is installed on the elevating actuator 2012 for restricting the vertical descend distance of the swing arm 2010 so as to restrict the press force of the brush head 2016 pressing on the wafer surface in an acceptable range. A strain gauge 2013 is positioned on the swing arm 2010 to monitor the deformation of the coil spring 2006 while the brush head 2016 pressing on the wafer surface.

The apparatus further includes a cleaning chamber 2000. The cleaning chamber 2000 includes a water chuck, a rotation driving mechanism and at least one nozzle. The wafer chuck is disposed in the cleaning chamber 2000 for holding and positioning a wafer 2001. The rotation driving mechanism drives the wafer chuck to rotate. The at least one nozzle 2019 delivers cleaning chemicals or de-ionized water onto the surface of the wafer 2001.

A brush cleaning port 2040 is arranged beside the cleaning chamber 2000 and used for cleaning the brush head 2016 when the brush head 2016 is idle and checking whether the brush module 2018 is in normal status. The brush cleaning port 2040 includes at least one outlet 2043 and at least one inlet 2041. A force sensor 2045 is installed at the bottom of the brush cleaning port 2040 and is connected with a controller through a signal cable 2047. A cover 2049 shields the force sensor 2045 for protecting the force sensor 2045 from contacting cleaning liquid in the brush cleaning port 2040. When the brush head 2016 is idle, the rotating actuator 2011 drives the swing arm 2010 to move out of the cleaning chamber 2000 and move into the brush cleaning port 2040. The elevating actuator 2012 drives the brush head 2016 to move down to the brush cleaning port 2040 with a preset height of the cleaning position. The cleaning liquid, such as de-ionized water, sprays to the brush head 2016. A gap is set between the brush head 2016 and the force sensor 2045. If the brush module 2018 is abnormal, such as the coil spring 2006 working abnormally, the force sensor 2045 detects the press force and sends out a signal to prevent the apparatus from processing the wafer 2001.

Figure 3A:
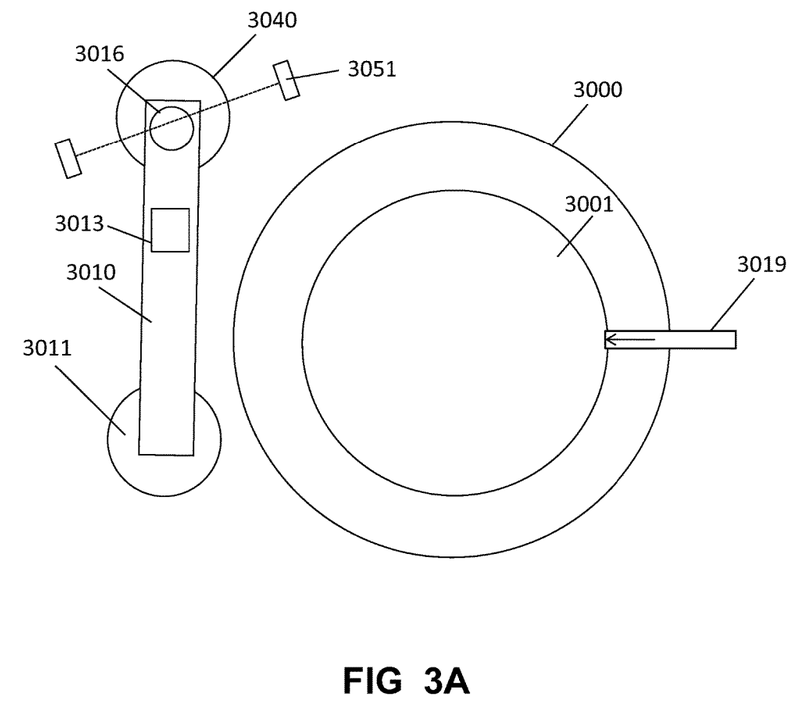
FIGS. 3A and 3B illustrate an apparatus for cleaning semiconductor wafer according to further another exemplary embodiment of the present invention.
Figure 3B:
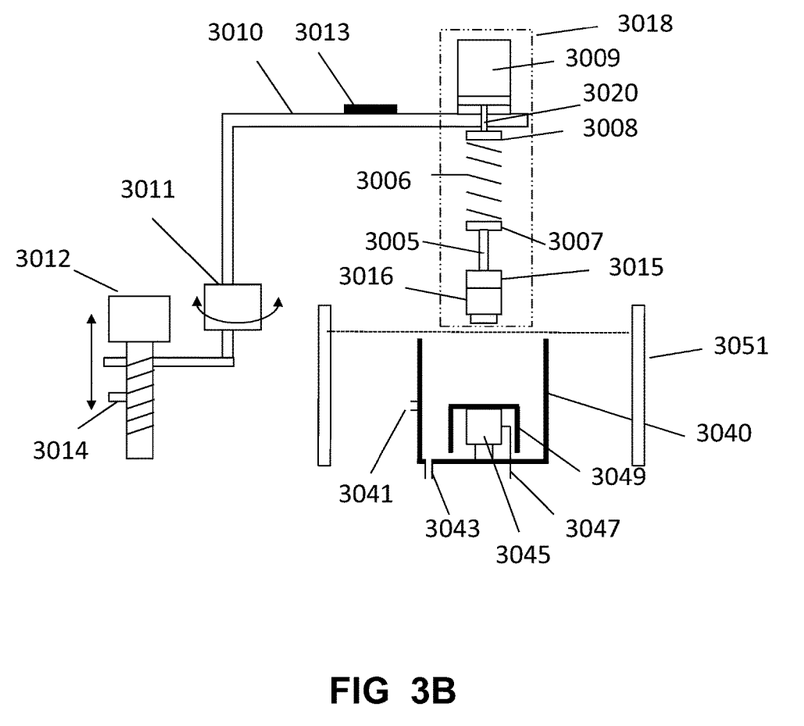

Referring to FIGS. 3A and 3B illustrating an apparatus for cleaning semiconductor wafer according to further another exemplary embodiment of the present invention, the apparatus includes a brush module 3018, a swing arm 3010, a rotating actuator 3011 and an elevating actuator 3012.

The brush module 3018 is mounted on an end of the swing arm 3010. The brush module 3018 is vertically disposed and includes a brush head 3016, a brush base 3015, a lower bearing 3005, a lower mounting section 3007, a coil spring 3006, an upper mounting section 3008, an upper bearing 3020 and a damper 3009. The brush head 3016 is mounted on the brush base 3015. An end of the lower bearing 3005 connects to the brush base 3015 and the other end of the lower bearing 3005 connects to the lower mounting section 3007. An end of the coil spring 3006 is fixed on the lower mounting section 3007 and the other end of the coil spring 3006 is fixed on the upper mounting section 3008 which is disposed opposite the lower mounting section 3007. The upper mounting section 3008 connects to an end of the upper bearing 3020 and the other end of the upper bearing 3020 connects to the damper 3009. The damper 3009, which is liquid type or gas type, is used to keep the brush module 3018 stable at vertical direction during process.

The other end of the swing arm 3010 is connected with the rotating actuator 3011 and the elevating actuator 3012. The rotating actuator 3011 drives the swing arm 3010 to swing across a whole wafer surface, so the brush module 3018 may move across the whole wafer surface during the cleaning process. The elevating actuator 3012 drives the swing arm 3010 to rise or descend, so the press force that the brush module 3018 acts on the wafer surface can be adjusted. The swing arm 3010 is able to swing, rise or descend, or swing and simultaneously rise or descend under the drive of the rotating actuator 3011 or/and the elevating actuator 3012. A hard stopper 3014 is installed on the elevating actuator 3012 for restricting the vertical descend distance of the swing arm 3010 so as to restrict the press force of the brush head 3016 pressing on the wafer surface in an acceptable range. A strain gauge 3013 is positioned on the swing arm 3010 to monitor the deformation of the coil spring 3006 while the brush head 3016 pressing on the wafer surface.

The apparatus further includes a cleaning chamber 3000. The cleaning chamber 3000 includes a wafer chuck, a rotation driving mechanism and at least one nozzle 3019. The wafer chuck is disposed in the cleaning chamber 3000 for holding and positioning a wafer 3001. The rotation driving mechanism drives the wafer chuck to rotate. The at least one nozzle 3019 for delivers cleaning chemicals or de-ionized water onto the surface of the wafer 3001.

A brush cleaning port 3040 is arranged beside the cleaning chamber 3000 and used for cleaning the brush head 3016 when the brush head 3016 is idle and checking whether the brush module 3018 is in normal status. The brush cleaning port 3040 includes at least one outlet 3043 and at least one inlet 3041. A force sensor 3045 is installed at the bottom of the brush cleaning port 3040 and is connected with a controller through a signal cable 3047. A cover 3049 shields the force sensor 3045 for protecting the force sensor 3045 from contacting cleaning liquid in the brush cleaning port 3040. A couple of brush position sensors 3051 are settled at opposite sides of the brush cleaning port 3040 for checking the status of the brush module 3018. The brush position sensors 3051 will be triggered when the brush head 3016 moves down in the brush cleaning port 3040. The vertical moving distance of the brush head 3016 at the time that the brush position sensors 3051 are triggered is recorded, and is compared each time. If the value of vertical moving distance is out of the preset range, a signal of the brush module 3018 abnormal is sent out.

Figure 4:
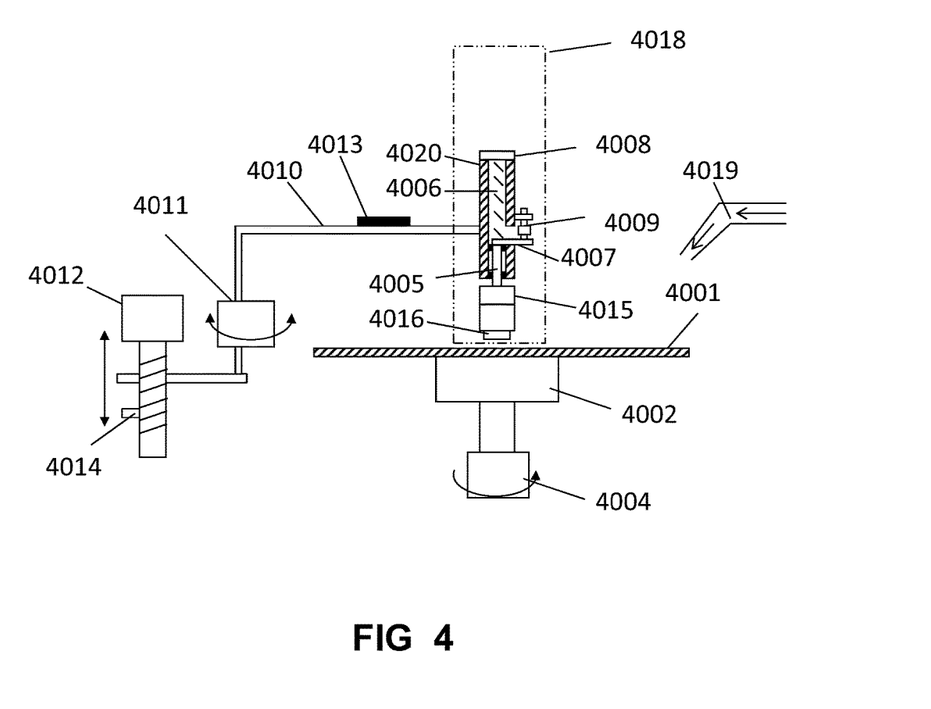
FIG. 4 illustrates an apparatus for cleaning semiconductor wafer according to further another exemplary embodiment of the present invention.

Referring to FIG. 4 illustrating an apparatus for cleaning semiconductor wafer according to further another exemplary embodiment of the present invention, the apparatus includes a brush module 4018, a swing arm 4010, a rotating actuator 4011 and an elevating actuator 4012.

The brush module 4018 is mounted on an end of the swing arm 4010. The brush module 4018 is vertically disposed and includes a brush head 4016, a brush base 4015, a bearing 4005, a flexible component 4007, at least one damper 4009, a coil spring 4006, a mounting section 4008 and a brush shell 4020. The brush head 4016 is mounted on the brush base 4015. An end of the bearing 4005 connects with the brush base 4015 and the other end of the bearing 4005 penetrates into the brush shell 4020 and connects to a side of the flexible component 4007. The other side of the flexible component 4007 connects with the damper 4009 which is mounted on the brush shell 4020 and used for keeping the brush module 4018 stable at vertical direction during process. The coil spring 4006 is received in the brush shell 4020. An end of the coil spring 4006 is fixed on the side of the flexible component 4007 and the other end of the coil spring 4006 is fixed on the mounting section 4008 which is disposed at the top of the brush shell 4020 and opposite to the flexible component 4007. The mounting section 4008 can be the top plate of the brush shell 4020. The brush shell 4020 is fixed at the end of the swing arm 4010 for mounting the brush module 4018 on the end of the swing arm 4010.

The other end of the swing arm 4010 is connected with the rotating actuator 4011 and the elevating actuator 4012. The rotating actuator 4011 drives the swing arm 4010 to swing across a whole wafer surface, so the brush module 4018 may move across the whole wafer surface during the cleaning process. The elevating actuator 4012 drives the swing arm 4010 to rise or descend, so the press force that the brush module 4018 acts on the wafer surface can be adjusted. The swing arm 4010 is able to swing, rise or descend, or swing and simultaneously rise or descend under the drive of the rotating actuator 4011 or/and the elevating actuator 4012. A hard stopper 4014 is installed on the elevating actuator 4012 for restricting the vertical descend distance of the swing arm 4010 so as to restrict the press force of the brush head 4016 pressing on the wafer surface in an acceptable range. A strain gauge 4013 is positioned on the swing arm 4010 to monitor the deformation of the coil spring 4006 while the brush head 4016 pressing on the wafer surface.

The apparatus further includes a cleaning chamber. The cleaning chamber includes a wafer chuck 4002, a rotation driving mechanism 4004 and at least one nozzle 4019. The wafer chuck 4002 is disposed in the cleaning chamber for holding and positioning a wafer 4001 The rotation driving mechanism 4004 drives the wafer chuck 4002 to rotate. The at least one nozzle 4019 delivers cleaning chemicals or de-ionized water onto the surface of the wafer 4001.

A method for cleaning semiconductor wafer according to the present invention is also disclosed.

Step 1: loading a wafer on a wafer chuck and rotating the wafer with a speed of 30 RPM to 1500 RPM.

Step 2: delivering cleaning chemicals or de-ionized water onto the surface of the wafer, wherein the flow rate of the cleaning chemicals or de-ionized water is controlled in range of 100 ml/min to 4000 ml/min.

Step 3: moving a brush module into a cleaning chamber and a brush head of the brush module being above the surface of the wafer.

Step 4: moving the brush module down to a position close to the surface of the wafer at a first speed which is controllable.

Step 5: moving the brush module down to a process position with a preset height at a second speed which is controllable and slower than the first speed.

Step 6: swinging the brush head of the brush module across the surface of the wafer based on a pre-set recipe.

Step 7: moving the brush module up to a position above the wafer.

Step 8: swinging the brush module out of the cleaning chamber, and preferably swinging the brush module to a brush cleaning port to clean the brush head.

Step 9: stopping delivering cleaning chemicals or de-ionized water to the surface of the wafer.

Step 10: drying the wafer.

Step 11: unloading the wafer from the wafer chuck.

In the step 5, the brush module's height of the process position is pre-calibrated according to the press force that the brush head acted on the surface of the wafer.

In the step 8, the brush head cleaning process includes moving the brush head down into the brush cleaning port where the cleaning liquid is sprayed to the brush head. And in the normal case, the brush head is kept a distance from a force sensor mounted inside the brush cleaning port. The force sensor detects the force when the brush module is abnormal, such as a coil spring of the brush module being abnormal, alarm occurs in the system and the wafer is stopped to feed in.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

The invention claimed is:

1. An apparatus for cleaning semiconductor wafer comprising:
    a brush module having a brush head for providing mechanical force on a surface of a wafer;
    a swing arm of which an end mounts the brush module, wherein the brush module is vertically disposed and includes a brush base, a bearing, a flexible component, at least one damper, a mounting section, a brush shell and a coil spring, the brush head is mounted on the brush base, an end of the bearing connects with the brush base and the other end of the bearing penetrates into the brush shell and connects to a side of the flexible component, the other side of the flexible component connects with the damper which is mounted on the brush shell, the coil spring is received in the brush shell, an end of the coil sing is fixed on the side of the flexible component and the other end of the coil spring is fixed on the mounting section which is the top plate of the brush shell and opposite to the flexible component, the brush shell is fixed at the end of the swing arm, an elastic deformation of the coil spring generates a press force that the brush head acts on the surface of the wafer, and the elastic deformation of the coil spring is determined by a height of a process position of the brush module;
    a rotating actuator connected with the other end of the swing arm, the rotating actuator driving the swing arm to swing across the whole surface of the wafer, which brings the brush head moving across the whole surface of the wafer; and
    an elevating actuator connected with the other end of the swing arm, the elevating actuator driving the swing arm to rise or descend, which brings the brush module rising or descending.

2. The apparatus as claimed in claim 1, wherein the swing arm swings, rises or descends, or swings and simultaneously rises or descends under the drive of the rotating actuator or/and the elevating actuator.

3. The apparatus as claimed in claim 1 wherein the elevating actuator is installed with a hard stopper for restricting a vertical descend distance of the swing arm so as to restrict a press force of the brush head pressing on the wafer surface in an acceptable range.

4. The apparatus as claimed in claim 1, further comprising a strain gauge positioned on the swing arm to monitor the deformation of the coil spring while the brush head pressing on the wafer surface.

5. The apparatus as claimed in claim 4, further comprising a controller respectively connecting with the strain gauge and the elevating actuator, the press force of the brush module acted on the surface of the wafer detected by the strain gauge and the strain gauge producing a detecting signal, the strain gauge sending the detecting signal to the controller, the controller receiving the detecting signal and giving a feedback to the elevating actuator, the elevating actuator adjusting the height of the process position of the swing arm based on the feedback of the controller.

6. The apparatus as claimed in claim 1, further comprising a brush cleaning port for cleaning the brush head.

7. The apparatus as claimed in claim 6, wherein the brush cleaning port includes a force sensor installed at the bottom of the brush cleaning port and a signal cable connecting the force sensor to a controller for checking whether the brush module is in normal status.

8. The apparatus as claimed in claim 7, wherein the brush cleaning port includes a cover shielding the force sensor for protecting the force sensor from contacting cleaning liquid in the brush cleaning port.

9. The apparatus as claimed in claim 6, further comprising a couple of brush position sensors settled at opposite sides of the brush cleaning port for checking a status of the brush module, the couple of brush position sensors being triggered when the brush head moves down in the brush cleaning port, the vertical moving distance of the brush head at the time that the brush position sensors are triggered being recorded and compared every time, if the value of vertical moving distance is out of the preset range, a signal of the brush module abnormal is sent out.

10. The apparatus as claimed in claim 1, further comprising a cleaning chamber, a wafer chuck disposed in the cleaning chamber for holding and positioning a wafer, a rotation driving mechanism for driving the wafer chuck to rotate, and at least one nozzle for delivering cleaning chemicals or de-ionized water onto the surface of the wafer.

* * * * *